US007005354B2

(12) United States Patent
Pan et al.

(10) Patent No.: US 7,005,354 B2
(45) Date of Patent: Feb. 28, 2006

(54) DEPLETION DRAIN-EXTENDED MOS TRANSISTORS AND METHODS FOR MAKING THE SAME

(75) Inventors: Shanjen Pan, Plano, TX (US); James R. Todd, Plano, TX (US); Sameer Pendharkar, Richardson, TX (US); Tsutomu Kubota, Inbagun (JP); Pinghai Hao, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/669,111

(22) Filed: Sep. 23, 2003

(65) Prior Publication Data

US 2005/0064670 A1 Mar. 24, 2005

(51) Int. Cl.
*H01L 21/336* (2006.01)
*H01L 21/8238* (2006.01)

(52) U.S. Cl. ...................... 438/286; 438/262; 438/301; 438/228

(58) Field of Classification Search ................ 438/286, 438/278, 289, 262, 228, 224
See application file for complete search history.

(56) References Cited

U.S. PATENT DOCUMENTS 4,329,186 A * 5/1982 Kotecha et al. ............. 438/286
5,406,110 A 4/1995 Kwon et al.
5,501,994 A 3/1996 Mei
5,627,194 A * 5/1997 Rakhit et al. ............... 514/315
5,650,658 A * 7/1997 Beasom ...................... 257/409
5,736,766 A 4/1998 Efland et al.
6,071,768 A 6/2000 Duvvury et al.
6,140,683 A 10/2000 Duvvury et al.
6,211,552 B1 4/2001 Efland et al.
6,225,673 B1 5/2001 Pendharkar et al.
6,372,586 B1 4/2002 Efland et al.
6,424,005 B1 7/2002 Tsai et al.
6,441,431 B1 8/2002 Efland et al.
6,468,837 B1 10/2002 Pendharkar et al.
6,521,946 B1 * 2/2003 Mosher ...................... 257/336
6,639,284 B1 * 10/2003 Chatterjee et al. .......... 257/355

* cited by examiner

*Primary Examiner*—Michael Lebentritt
*Assistant Examiner*—Ron Pompey
(74) *Attorney, Agent, or Firm*—Jacqueline J. Garner; W. James Brady, III; Frederick J. Telecky, Jr.

(57) ABSTRACT

Depletion drain-extended MOS transistor devices and fabrication methods for making the same are provided, in which a compensated channel region is provided with p and n type dopants to facilitate depletion operation at Vgs=0, and an adjust region is implanted in the substrate proximate the channel side end of the thick gate dielectric structure for improved breakdown voltage rating. The compensated channel region is formed by overlapping implants for an n-well and a p-well, and the adjust region is formed using a Vt adjust implant with a mask exposing the adjust region.

18 Claims, 7 Drawing Sheets

DEPLETION DRAIN-EXTENDED MOS TRANSISTORS AND METHODS FOR MAKING THE SAME

RELATED APPLICATION

This application is related to application Ser. No. 10/155,543 filed May 24, 2002, which is entitled "Method of Manufacturing and Structure of Semiconductor Device with Floating Ring Structure".

FIELD OF INVENTION

The present invention relates generally to semiconductor devices and more particularly to depletion drain-extended MOS transistor devices and fabrication methods for making the same.

RELATED APPLICATIONS

This application is related to U.S. patent application Ser. No. 10/461,214, filed on Jun. 13, 2003, entitled "LDMOS TRANSISTORS AND METHODS FOR MAKING THE SAME".

BACKGROUND OF THE INVENTION

Power semiconductor products are often fabricated using extended-drain N or P channel MOS transistors, where current is to be switched at high voltages. These drain-extended devices offer high current handling capabilities and are able to withstand large blocking voltages without suffering voltage breakdown failure. Accordingly, such transistors are ideally suited for power switching applications, particularly where inductive loads are to be driven. N-type drain-extended MOS devices (DENMOS transistors) are asymmetrical devices in which a p-type channel region is typically formed in a p-well between an n-type source and an extended n-type drain. Low n-type doping on the drain side provides a large depletion layer able to withstand high blocking voltages.

Depletion NMOS transistor devices have a threshold voltage (Vt) that is less than zero (e.g., negative Vt), whereby the channel is conductive when Vgs is zero. Depletion transistors are sometimes used in power management startup circuits and other applications in which a constant low on-state current is needed with no gate biasing. N-channel depletion devices allow conduction between the transistor drain and the source when a positive drain voltage is applied without having to positively bias the gate, and thus are desirable for creating current sources or resistive-type loads (e.g., such as a pull-up load for NMOS inverters) in power management or other types of circuits. In many applications, the depletion MOS device gate is connected to the source so that Vgs=0, and the transistor is always on (e.g., Vgs>Vt). In this configuration, the operation of the depletion MOS is analogous to a resistance, wherein the effective resistance is generally proportional to the ratio of the transistor length and width.

In certain power management circuit applications, current sources are needed for providing a current in the presence of relatively high drain voltages. For example, 30 volts or more may be provided to the depletion MOS drain terminal in mixed signal device power conditioning circuitry, wherein startup circuitry requires a current source without any gate bias voltage. However, conventional depletion MOS devices are not well suited for operation with such high drain voltages. In particular, such devices typically suffer from poor breakdown voltage ratings (e.g., the drain-to-source voltage at which breakdown occurs, BVdss), where breakdown voltage is often measured as drain-to-source breakdown voltage with the gate and source shorted together. Accordingly, there remains a need for improved depletion MOS transistor devices capable of operating with high drain voltages, as well as manufacturing techniques for fabricating the same.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The invention relates to depletion drain-extended MOS transistor devices and fabrication methods for making the same, wherein a compensated channel region is provided with both "p" and "n" type dopants to facilitate depletion (e.g., depletion MOS) operation at low or zero gate voltages (e.g., at Vgs=0). In one implementation, the compensated channel region is formed by overlapping implants for an n-well and a p-well. For a high-voltage NMOS type, the extended-drain device (e.g., DENMOS) includes a thick gate dielectric, wherein an adjust region may be provided with p-type dopants (e.g., n-type dopants for a PMOS) in the substrate proximate the channel side end of the thick gate dielectric structure. In one example, the adjust region is formed using a Vt adjust implant with a mask exposing the adjust region.

In operation, the compensated channel region allows depletion operation at Vgs=0, and the adjust region doping facilitates operation at high drain voltages without device breakdown (e.g., BVdss rating above 30 V in one example). In this regard, the inventors have found that providing the second type dopants in the adjust region mitigates current flow constriction as electrons move from the source to the drain at the transition from the thin dielectric to the thick dielectric. This allows safe device operation at high drain voltages by reducing the electric field gradient at the edge of the thick dielectric (e.g., effectively spreading out the field throughout the extended drain). In this manner, the on-state resistance (e.g., Rdson) of the depletion MOS is kept relatively low, while the breakdown voltage performance (e.g., BVdss) of the resulting transistor is improved (e.g., allowing operation with higher drain voltages). In addition, the adjust region dopants help to mitigate channel hot carrier (CHC) degradation.

One aspect of the invention relates to methods for fabricating depletion drain-extended MOS transistors. The method comprises forming a source and a drain of a first conductivity type (e.g., n or p) in a substrate (e.g., silicon or SOI wafer), and forming a gate structure over a channel region of the substrate. The gate structure comprises a thick dielectric, a thin dielectric, and a conductive gate contact structure. The thick dielectric has a first end adjacent the drain and extends laterally toward the source to a second opposite end, and also extends vertically into the substrate. The thin dielectric extends over the substrate from the second end of the thick dielectric to the source, and the gate contact structure extends over the thin dielectric and over a portion of the thick dielectric. The method further comprises forming a compensated channel region comprising dopants of the first and second conductivity types in the substrate extending below a portion of the thin dielectric, such as by overlapping p-well and n-well implants. In one implementation, the method also includes forming an adjust region in the substrate proximate the second end of the thick dielectric, comprising dopants of the second conductivity type.

Another aspect of the invention provides methods for fabricating a depletion drain-extended MOS transistor, comprising forming first and second wells of first and second conductivity types, respectively, in a substrate, wherein portions of the first and second wells overlap in a compensated channel region of the substrate. A drain of the first conductivity type is formed in a portion of the first well and a source of the first conductivity type is formed in a portion of the second well. The method further comprises forming a thick dielectric, for example, using LOCOS or STI processes, which extends laterally from a first end adjacent the drain to a second opposite end in the first well and vertically into the first well. A thin dielectric is formed, extending over the substrate from the second end of the thick dielectric in the first well to the source in the second well, where a portion of the thin dielectric extends over the compensated channel region. The method also comprises forming a conductive gate contact structure extending over the thin dielectric and over a portion of the thick dielectric, and providing dopants of the second conductivity type in an adjust region of the first well in the substrate proximate the second end of the thick dielectric.

In one implementation, the first well has a concentration of dopants of the first conductivity type less than or equal to a first concentration value proximate the second end of the thick dielectric, and the adjust region has a concentration of dopants of the second conductivity type at a second lower concentration value. The second type dopants may advantageously be implanted into the adjust region during a Vt adjust implant using a Vt adjust mask that exposes the adjust region of the substrate, whereby additional masks are not needed during manufacturing. For example, a p-type adjust region may be implanted for depletion DENMOS transistors during a Vtn implant, to provide boron or other p-type dopants to the adjust region as well as to source/drain regions of other n-channel transistors in a semiconductor device after forming the thick dielectric and other isolation structures.

The formation of the compensated channel region may likewise be advantageously accomplished using existing process steps used to form n-wells and p-wells in a manufacturing process flow. In one implementation, the first well is implanted using a first well mask exposing the compensated channel region, and the second well is implanted using a second mask that also exposes the compensated channel region. The dopants of the first conductivity type are implanted using the first mask at a first implantation dose, and dopants of the second conductivity type are implanted using the second mask at a second implantation dose, wherein the first dose is greater than or equal to the second dose to facilitate depletion operation of the drain-extended MOS device. Thus, for a depletion DENMOS device, the n-well implant dose is the same or higher than the p-well dose, thereby ensuring depletion MOS operation.

In another aspect of the invention, a depletion drain-extended MOS transistor is provided, comprising a source and a drain of a first conductivity type formed in a substrate, and a gate structure disposed over a channel region of the substrate. The gate structure comprises a thick dielectric, a thin dielectric, and a conductive gate contact structure, where the thick dielectric has a first end adjacent the drain and extends laterally toward the source to a second opposite end and vertically into the substrate. The thin dielectric extends over the substrate from the second end of the thick dielectric to the source, and the gate contact structure extends over the thin dielectric and over a portion of the thick dielectric. The transistor further comprises a compensated channel region in the channel region of the substrate that extends below a portion of the thin dielectric and comprises dopants of the first and second conductivity types. An adjust region is created in the substrate proximate the second end of the thick dielectric, that comprises dopants of the second conductivity type.

In one exemplary implementation, the drain is formed in a first well of the first conductivity type in the substrate and the source is formed in a second well of a second opposite conductivity type in the substrate, wherein portions of the first and second wells overlap in the compensated channel region. The first well comprises dopants of the first conductivity type at a first concentration and the second well comprises dopants of the second conductivity type at a second concentration, wherein the first concentration is greater than or equal to the second concentration.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
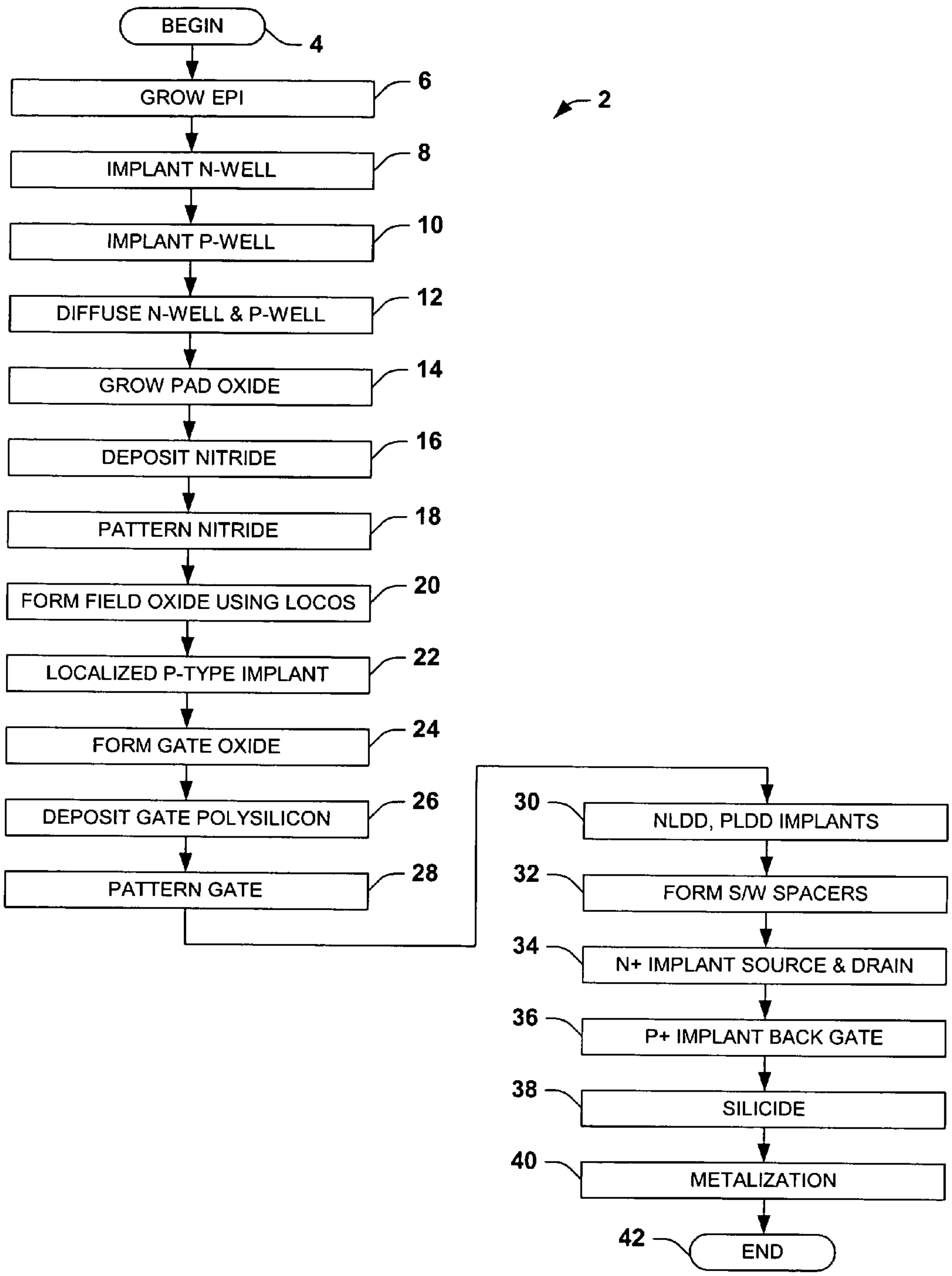
FIG. 1 is a flow diagram illustrating an exemplary method of fabricating a depletion drain-extended MOS transistor in accordance with an aspect of the invention.

One or more implementations of the present invention will now be described with reference to the attached drawings, wherein like reference numerals are used to refer to like elements throughout. The invention relates to depletion drain-extended MOS transistors and fabrication methods, wherein a compensated channel region is provided with p and n type dopants for depletion operation. An adjust region is provided in the substrate proximate a channel side end of a thick gate dielectric structure to facilitate high voltage operation with improved breakdown voltage performance and to inhibit CHC degradation. Although illustrated and described below in the context of n-channel devices (DENMOS transistors), the invention may also be employed in association with PMOS transistors. Furthermore, while the invention is illustrated and described with respect to DENMOS transistors fabricated using p-type silicon substrates with a p-type epitaxial layer formed thereover, the invention is not limited to the illustrated examples. In this regard, NMOS or PMOS transistors may be fabricated using any type of substrate, including but not limited to silicon or SOI wafers, wherein all such variants are contemplated as falling within the scope of the invention and the appended claims. In addition, it is noted that the various structures illustrated herein are not necessarily drawn to scale.

The inventors have found that current constriction is seen in conventional extended-drain MOS devices at the channel-side end of the thick dielectric portion of the gate structure, for both field oxide (e.g., LOCOS) or STI structures under the gate contact, particularly where high voltages are applied to the drain. Electrons flowing from the source through the channel and into the drain extension (n-well region for a DENMOS device) and ultimately into the drain, encounter higher effective impedance at the edge of the thick dielectric portion extending downward into the substrate. This current constriction adversely impacts the on-state resistance Rdson between the source and drain in these devices, reduces the breakdown voltage rating BVdss, and exacerbates CHC degradation.

The present invention allows a reduction in the current constriction at or near such abrupt dielectric steps, whereby on-resistance may be controlled and breakdown voltage ratings may be increased. This, in turn, facilitates the provision of high voltage depletion MOS transistors capable of operating with drain voltages of 30 V or more. In addition, the invention may advantageously reduce the susceptibility to CHC degradation in depletion MOS devices. Toward that end, an adjust region is provided to mitigate such current constriction, that may be created using an existing implantation (e.g., Vt adjust implant) in a process flow, by simply changing an existing implant mask design. Another aspect of the invention provides a compensated channel region comprising both p and n type dopants for depletion operation that may be employed in combination with the adjust region in depletion extended-drain devices. For the case of n-channel extended-drain (DENMOS) devices, a p-type dopant such as boron is provided in the region around the oxide step, referred to herein as an adjust region, wherein the implant dose (dopant concentration) and size of the implanted adjust region may be tailored to achieve a desired breakdown voltage rating. Similarly, PMOS depletion devices may be made, in which additional n-type dopants (e.g., arsenic, phosphorus, etc.) are provided in an adjust region proximate the channel-side end of the thick dielectric structure.

An exemplary method 2 is illustrated in FIG. 1 for fabricating depletion drain-extended NMOS transistors using LOCOS field oxidation processing, and an exemplary depletion DENMOS transistor 102 is illustrated in FIGS. 2A–2I at various stages of fabrication in accordance with the invention. Although the exemplary method 2 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the fabrication of devices which are illustrated and described herein as well as in association with other devices and structures not illustrated. For example, the exemplary method 2 may be employed in fabricating the exemplary depletion DENMOS device 102 as illustrated and described below with respect to FIGS. 2A–2I.

The method 2 is illustrated for the case of DENMOS devices, such as the transistor 102 of FIGS. 2A–2I, although the invention is also applicable to fabricating p-channel extended-drain depletion MOS devices. Beginning at 4, an epitaxial layer is grown at 6 over a silicon substrate, and n-type dopants (e.g., arsenic, phosphorus, and/or others) are selectively implanted at 8 into portions of the epitaxial layer to form n-well regions using a mask which exposes the prospective n-well regions and a prospective overlap area or compensated channel region, where the mask covers the remainder of the wafer. In one implementation, the n-well implant at 8 comprises implanting phosphorus using a dose of about 1E13 $cm^{-2}$ and an energy of about 150 keV, although other n-type implants can be used. P-type dopants (e.g., boron, etc.) are implanted at 10 into prospective p-well regions and into the compensated channel region using a second mask. In one example, the p-well implant at 10 comprises implanting boron using a dose of about 1E13 $cm^{-2}$ and an energy of about 50 keV. Alternatively, the p-well implant 10 may be performed before the n-well implant at 8. In other implementations, a buried layer, such as an n-type buried layer implant (e.g., NBL illustrated and described below with respect to FIGS. 5 and 7) can be formed prior to the well implants at 8 and 10, to provide isolation between the resulting transistor and the substrate.

A thermal process is performed at 12, which diffuses the n-type and p-type dopants further into the epitaxial layer (e.g., and possibly into the underlying substrate), and thereby extends the n-wells, p-wells, and the compensated channel region deeper below the wafer surface, for example, to about 2–4 um in one implementation. In this manner, a compensated channel region is formed in the substrate, that may be of any suitable lateral length and width dimensions, for example, such as having a length of about 5 um in one implementation. Although the illustrated methods and devices herein provide a compensated channel region through overlapping implants of n-wells and p-wells under a prospective gate structure location, alternative techniques can be used to form such a region having p and n type dopants. For instance, a separate implantation mask may be employed for providing n or p type dopants into the compensated channel region, and/or diffusion techniques may be used alone or in combination with implantation steps to provide a compensated channel region within the scope of the invention.

It is also noted that the compensated channel region may be formed at any point in a fabrication processing flow, wherein the illustrated example advantageously forms the compensated channel region using existing p and n-well implant steps with masks adjusted such that both well implant masks expose the compensated channel region. In a preferred implementation of the exemplary method 2, the n-type dopants in the compensated channel region are of the same or higher concentration than are the p-type dopants for a DENMOS, wherein the converse is desired for a PMOS implementation, and wherein the well implantation doses may be adjusted accordingly to achieve such concentrations.

Field oxide isolation structures and thick DENMOS gate dielectric structures are then formed at 14–20. Alternatively, such structures can be formed using shallow trench isolation (STI) processing or other suitable techniques as illustrated below in FIGS. 6 and 7 within the scope of the invention. At 14, a pad oxide layer is formed over the wafer, which may be deposited or thermally grown using any appropriate oxide formation techniques. At 16, a nitride layer is deposited and is then patterned at 18 to provide an oxidation mask covering prospective active regions and exposing prospective isolation or field regions of the wafer. The nitride mask also exposes a portion of the n-well region to allow subsequent formation of a thick dielectric for the DENMOS gate structure.

At 20, a local oxidation of silicon (LOCOS) process is employed to form a thick field oxide dielectric structure extending laterally from a first end adjacent a prospective drain region of the DENMOS to a second opposite end in the n-well. The thick field oxide dielectric formed at 20 also extends vertically downward from the wafer surface into the n-well and above the surface, for example, having a total thickness of about 5200 Å in one example. The LOCOS process at 20 may also operate to further diffuse the p-type and/or n-type dopants deeper into the wafer. Although the exemplary method 2 provides field oxide dielectric material (e.g., $SiO_2$) for the thick dielectric of the final DENMOS gate structure, any suitable dielectric material may alternatively be formed using any suitable process within the scope of the invention. Following the LOCOS processing at 20, the nitride mask and the pad oxide are removed.

An adjust region is then formed at 22 in the substrate proximate (e.g., near or adjacent to) the second end of the thick dielectric, comprising p-type dopants for the exemplary DENMOS transistor (n-type adjust region dopants for a PMOS). Any technique may be used to provide the p-type dopants in the adjust region at 22 within the scope of the invention to facilitate high voltage operation of the depletion DENMOS with high breakdown voltage withstanding capability (e.g., high BVdss). In this regard, any suitable dopants, implantation energies, and dosage may be employed to provide p-type dopants in the adjust region at 22. Further, the adjust region may be alternatively formed at other points in a fabrication processing flow, wherein all such variant implementations are contemplated as falling within the scope of the invention and the appended claims.

In the illustrated method 2, the adjust region is formed using a series of threshold voltage adjust (e.g., Vt adjust) implants, which also concurrently provide boron or other p-type dopants to prospective channel regions of other n-channel transistors after formation of the thick dielectric and other isolation structures. In this implementation, the Vt adjust implantation at 22 is a three-step boron implantation operation using a single mask that exposes the source/drains of the NMOS logic transistors of the devices as well as exposing the adjust region. Using this mask, an initial Vt adjust implantation (e.g., boron) is performed using a dose of about 3E12 $cm^{-2}$ at an implantation energy of about 20 keV, then a punch-thru implant is performed at a dose of about 4E12 $cm^{-2}$ and an energy of about 70 keV. Thereafter, a somewhat deeper boron channel-stop implant is performed using a dose of about 5E12 $cm^{-2}$ and an energy of about 165 keV. This approach advantageously utilizes existing masking and implantation steps already present in the overall fabrication flow.

In another possible implementation, a single boron implant using a dose of about 5E12 $cm^{-2}$ at an energy of about 165 keV can be used to ensure penetration of the p-type dopants through the field oxide and into the adjust region of the substrate. Alternatively, the adjust region can be implanted prior to the LOCOS process at 20 (e.g., or following STI trench formation and prior to trench fill operations where STI techniques are used), or at any other point in a semiconductor device fabrication process. In the case of depletion extended-drain PMOS transistors, a similar Vt adjust process (e.g., single or multi-step) can be employed to provide n-type dopants to an adjust region. After formation of the adjust region at 22, the Vt adjust mask is removed using any suitable cleaning techniques.

At 24, a thin gate oxide is formed over the wafer surface, for example, by thermal oxidation processing, and a gate polysilicon layer is deposited at 26 over the thick dielectric and the thin gate oxide. The thin gate oxide and polysilicon are then patterned at 28 to form a gate structure, wherein the thin gate dielectric extends over the substrate from the second end of the thick dielectric to a prospective source in the p-well, and the patterned gate polysilicon extends over the thin gate oxide and over a portion of the thick field oxide dielectric. At 30, n and p-type lightly-doped drain implants (e.g., NLDD and PLDD implants) are performed to define n and p source/drain regions for NMOS and PMOS transistors, after which sidewall spacers are formed at 32 along the lateral sidewalls of the patterned gate structures. At 34, a source/drain implant (e.g., arsenic, phosphorus, etc.) is performed to further define the n-doped source and drain regions in the substrate, wherein the source is formed in the p-well and the drain is formed in the n-well at the first end of the thick dielectric. At 36, a back-gate contact region is then implanted with p-type dopants (e.g., boron, etc.). Silicide and metalization processing are then performed at 38 and 40, respectively, whereafter the method 2 ends at 40.

Figure 2A:
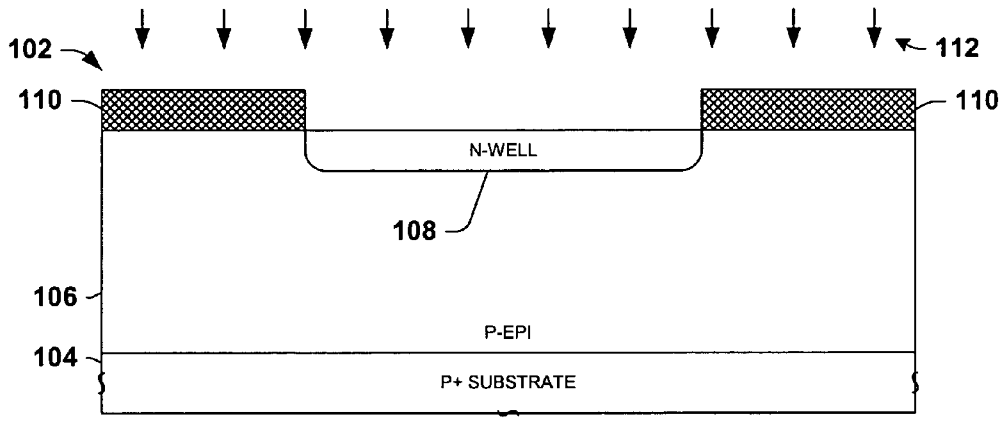
FIGS. 2A–2I are partial side elevation views in section illustrating an exemplary high voltage n-channel depletion MOS transistor (DENMOS) at various stages of fabrication in accordance with the invention.

Referring also to FIGS. 2A–2I, another aspect of the invention provides depletion MOS transistor devices with an adjust region to facilitate high voltage operation and a compensated channel region to facilitate depletion operation where Vgs=0. An exemplary n-channel extended-drain depletion transistor device (DENMOS) is illustrated in a semiconductor device 102 undergoing fabrication processing according to the invention, wherein the structures thereof are not necessarily drawn to scale. The device 102 comprises a P+silicon substrate 104 over which a p-type epitaxial layer 106 is formed to a thickness of about 4 um or greater. In FIG. 2A, an n-well 108 is implanted to an initial depth with n-type dopants (e.g., phosphorus, arsenic, etc.) using a mask 110 via an implantation process 112 at a dose of about 1E13 $cm^{-2}$ and an energy of about 150 keV.

Figure 2B:
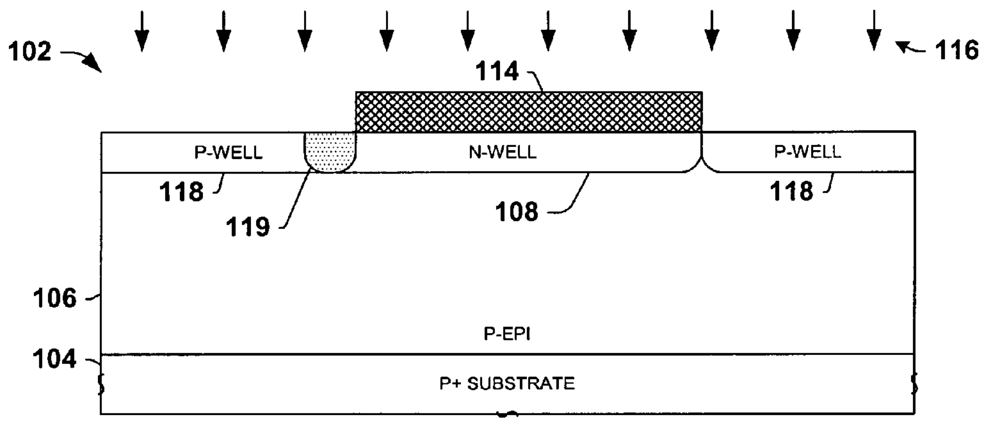
Figure 2C:
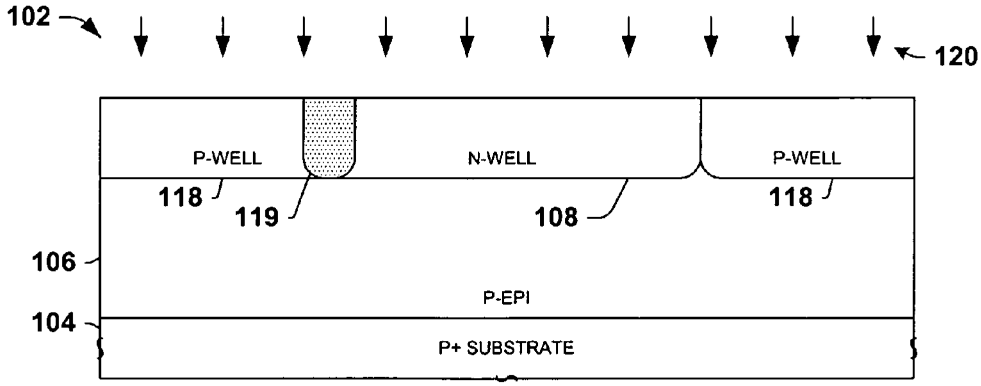

The mask 110 is removed, and a second well implant mask 114 is formed in FIG. 2B. A p-well implantation process 116 is then performed to provide p-type dopants to form a p-well 118 extending to a depth of about 1.5 um, wherein the masks 110 and 114 are such that a compensated channel region 119 is exposed to both implantations 112 and 116, and wherein the n-type dopant concentration in the region 119 is the same or higher than the p-type dopant concentration therein. In the exemplary device 102, the implantation 116 uses a dose of about 1E13 $cm^{-2}$ and an energy of about 20 keV. The mask 114 is then removed and a thermal anneal process 120 is performed in FIG. 2C to drive the n and p type dopants downward, thereby extending the n-well 108, the p-well 118, and the compensated channel region 119 deeper into the p-type epitaxial layer 106 (e.g., and possibly into the underlying P+ substrate 104).

Figure 2D:
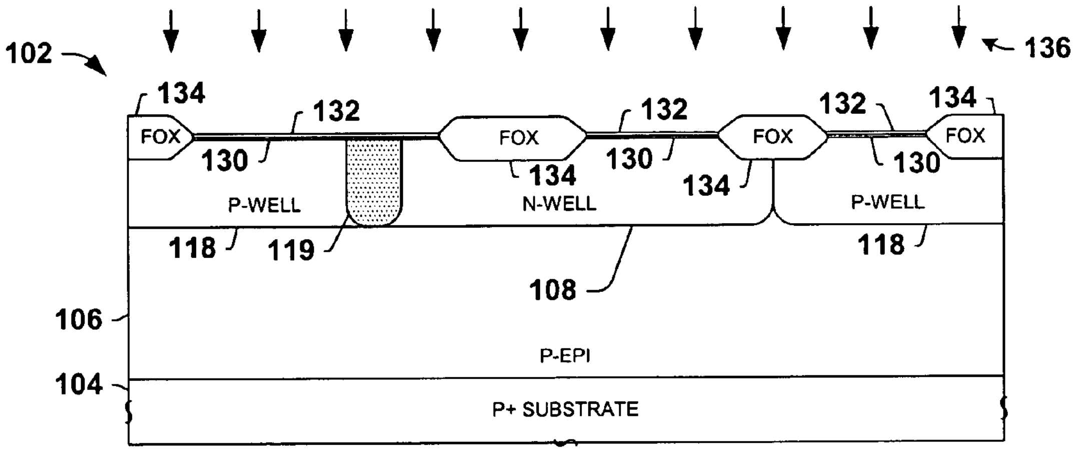

In FIG. 2D, a pad oxide layer 130 is grown over the wafer surface, and a nitride layer 132 is deposited and patterned using suitable lithographic processing techniques, to expose prospective field regions and to cover prospective active regions of the wafer surface. A LOCOS process 136 is then performed to create thick dielectric field oxide (FOX) structures 134. The field oxide 134 in the illustrated portion of the wafer provides a thick dielectric extending above and below the wafer surface by about 2600 Å in this example. One illustrated field oxide structure 134 is used in forming the DENMOS gate structure, while other similar field oxide structures 134 are concurrently provided elsewhere in the device 102 via the process 136 for isolation. Following the field oxide formation, the nitride 132 and the pad oxide 130 are removed.

Figure 2E:
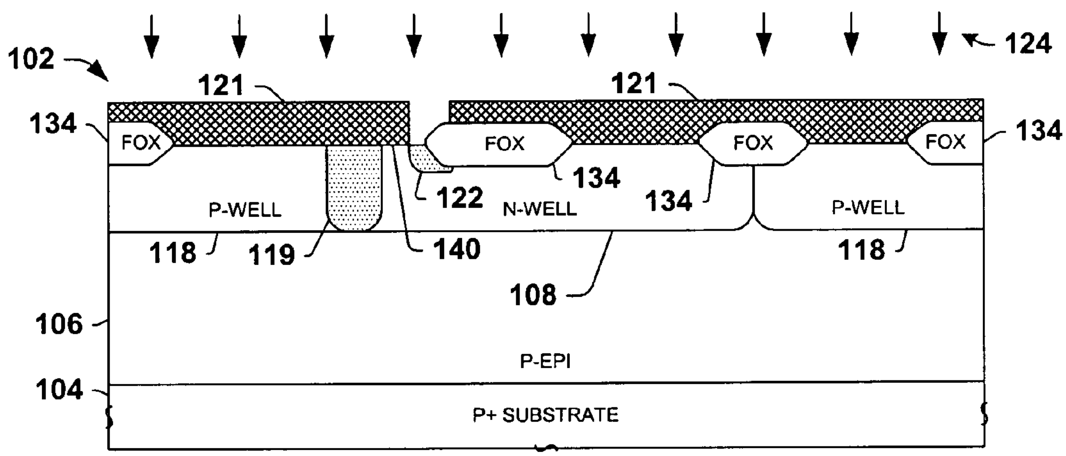

A mask 121 is then formed in FIG. 2E to expose prospective adjust regions 122, which are then implanted with p-type dopants (e.g., boron) using an implantation process 124 (e.g., referred to herein as a Vt adjust implant), which may be a single step or a multi-step implant (e.g., step 22 in the method 2 above). In the illustrated device 102, the process 124 comprises an initial boron Vt adjust implantation using a dose of about 3E12 $cm^{-2}$ at an implantation energy of about 20 keV, a punch-thru implant using a dose of about 4E12 $cm^{-2}$ at an energy of about 70 keV, and a channel-stop implant using a dose of about 5E12 $cm^{-2}$ at an energy of about 165 keV. As discussed above, these implants 124 are concurrently used to also provide p-type dopants to channel regions of other n-channel transistors (not shown) in the device 102, thereby saving on process flow masks and implantation steps. Alternate implementations are possible, for example, wherein a single boron implant 124 is performed a dose of about 5E12 $cm^{-2}$ at an energy of about 165 keV to ensure penetration of the p-type dopants through the field oxide 134 and into the adjust region 122. It is also noted that the adjust region 122 can alternatively be implanted prior to formation of the field oxide 134 or at any other suitable place in the fabrication process within the scope of the invention.

Figure 2F:
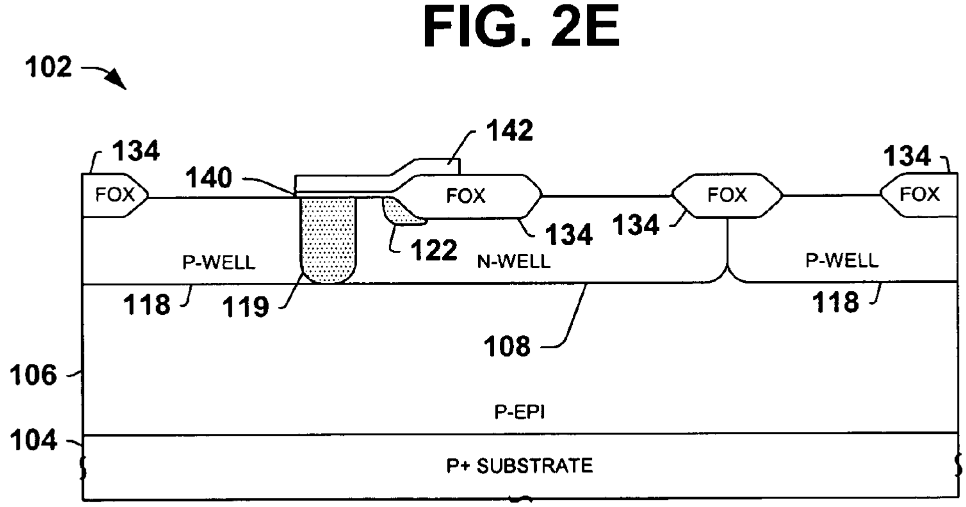

In FIG. 2F, transistor gate structures are formed, where a thin gate oxide layer 140 is grown over the wafer surface, and a layer of polysilicon 142 is then deposited over the field oxide 134 and the gate oxide 140. The thin gate oxide 140 and the polysilicon 142 are then patterned to define the gate structure, where the thin gate oxide 140 extends from the thick dielectric 134 to a prospective source in the p-well 118, and the gate polysilicon extends over the thin gate oxide 140 and a portion of the thick field oxide 134, as shown in FIG. 2F.

Figure 2G:
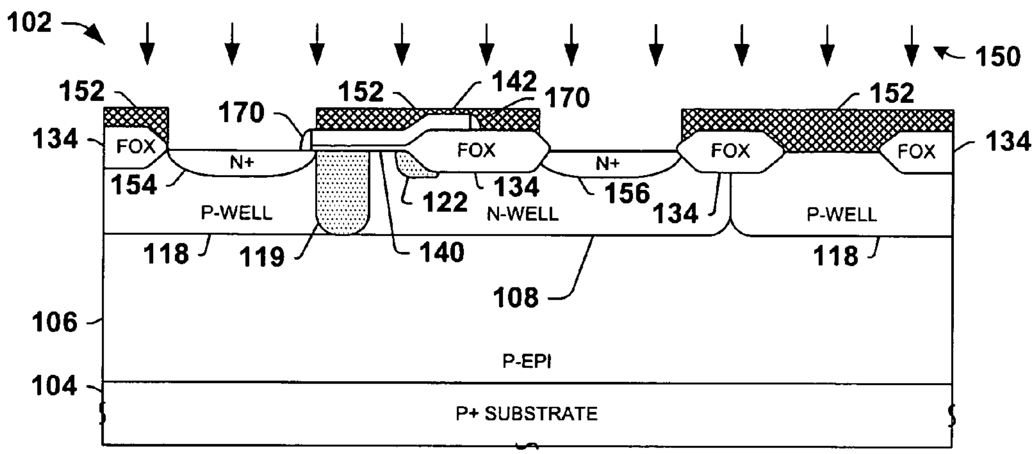
Figure 2H:
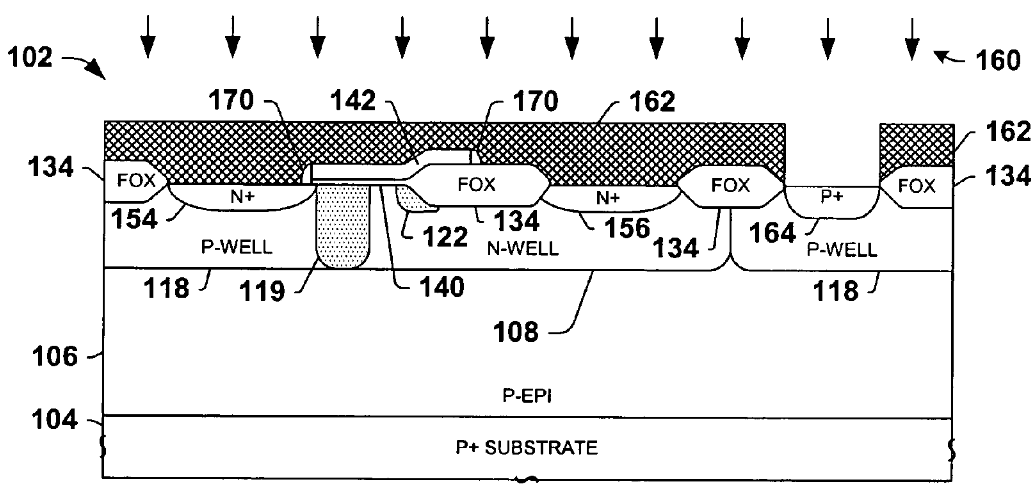
Figure 2I:
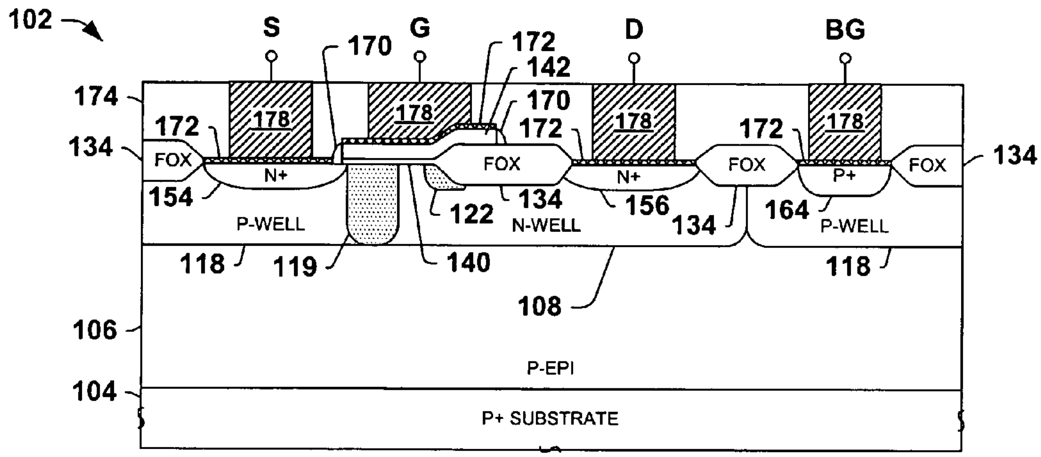

In FIG. 2G, NLDD and PLDD implants are performed, where the NLDD implant provides n-type dopants to a source region 154 and a drain region 156, after which sidewall spacers 170 are formed along the sidewalls of the gate 140,142. A source/drain implantation process 150 is performed using a mask 152 to further implant the n-type source and drain regions 154 and 156, respectively, where the source 154 is formed in the p-well 118 and the drain 156 is formed in the n-well 108 at the first end of the thick dielectric 134. In FIG. 2H, a p-type implantation process 160 is performed using another mask 162 to form a p-type back-gate contact region 164. As illustrated in FIG. 21, back end processing is performed, including silicidation to form conductive silicide 172 over the gate polysilicon 142, the source 154, the back-gate contact 164, and the drain 156. An initial interlayer or inter-level dielectric (ILD) material 174 is deposited over the device 102 and conductive contacts 178 (e.g., tungsten or other conductive material) are then formed through the dielectric 174 to couple with the silicided gate, back-gate, source, and drain terminals of the finished depletion DENMOS transistor.

The depletion DENMOS transistor includes an n-type drain 156 through which electrons flow from the source 154 and the channel region underlying the thin gate oxide 140, including the compensated channel region 119. The region 119 provides a negative threshold voltage Vt, thereby allowing depletion operation, while the p-type dopants provided in the adjust region 122 at the end of the field oxide 134 near the transition from the thin dielectric 140 reduces the resistance to electrons flowing from the channel toward the drain 156. This, in turn, facilitates high voltage operation (e.g., BVdss greater than 30 V in the illustrated example), without incurring device breakdown. These results are believed to exemplify advantages obtainable using the invention, wherein similar results are expected in the case of p-channel depletion MOS transistors, with n-doped regions being replaced by p-doped regions and vice-versa, as well as in other depletion extended-drain devices.

Figure 3:
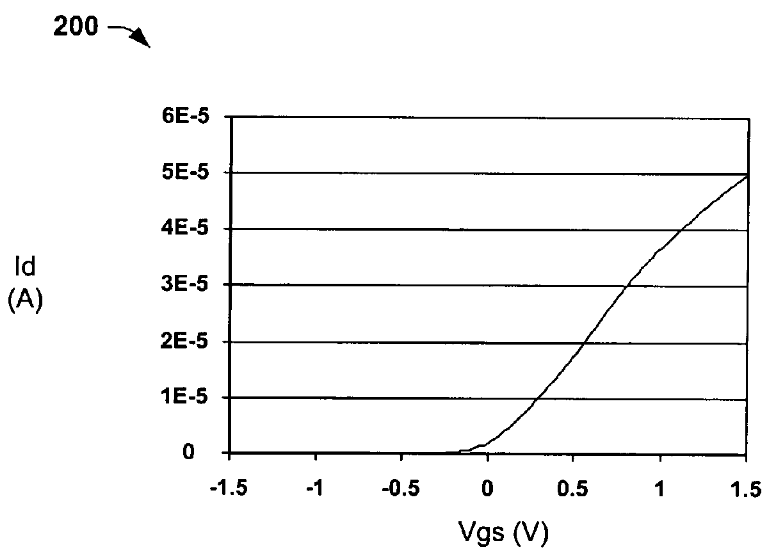
FIG. 3 is a plot illustrating drain current vs. gate-source voltage for the exemplary depletion DENMOS of FIGS. 2A–2I.
Figure 4:
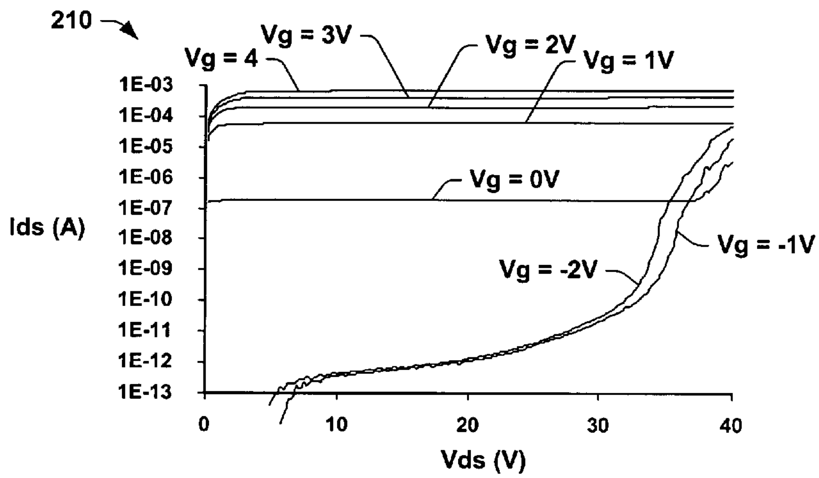
FIG. 4 is a plot illustrating drain-source current vs. drain-source voltage for the exemplary depletion DENMOS of FIGS. 2A–2I.

Referring now to FIGS. 3 and 4, plots 200 and 210 illustrate drain current vs. gate-source voltage and drain-source current vs. drain-source voltage, respectively, for the exemplary depletion DENMOS transistor of FIGS. 2A–2I. As can be seen in the plot 200 of FIG. 3, the exemplary DENMOS device provides depletion operation with a negative Vt, wherein a small drain current Id flows when the gate to-source voltage Vgs is zero. The plot 210 of FIG. 4 also illustrates depletion operation, wherein the current Ids is fairly constant above 1E–7 A at zero gate voltage for drain voltages (Vds) from zero to well above 30 V, and where current vs. drain voltage curves are shown for other (e.g., positive and negative) gate voltage values.

Figure 5:
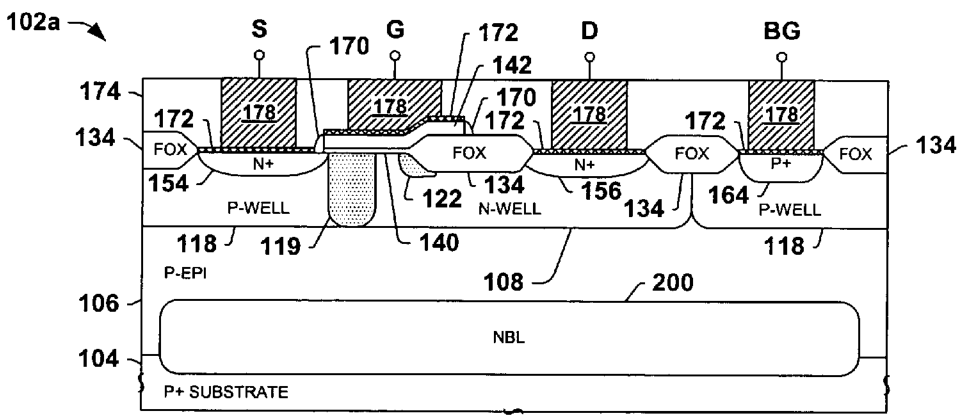
FIG. 5 is a partial side elevation view in section illustrating another exemplary high voltage depletion DENMOS transistor with a buried layer for isolation in accordance with the invention.
Figure 6:
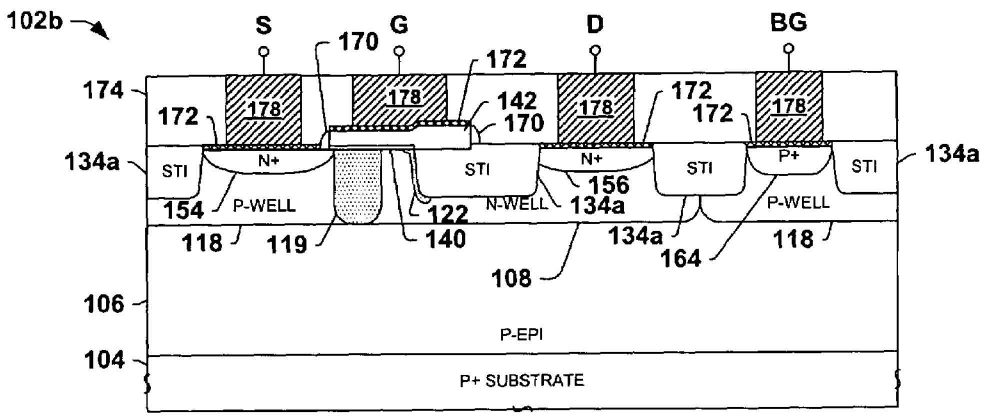
FIGS. 6 and 7 are partial side elevation views in section illustrating other exemplary high voltage depletion DENMOS transistors with and without buried layer isolation, employing STI type isolation structures in accordance with the invention.
Figure 7:
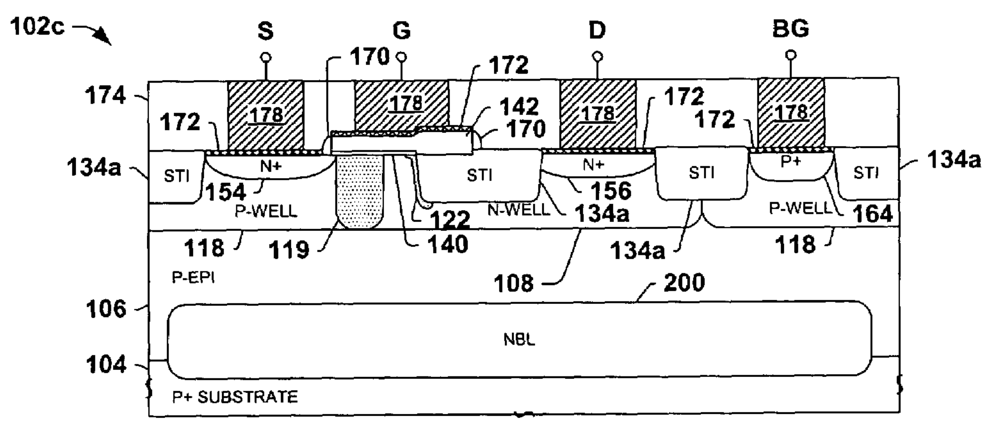

Referring now to FIGS. 5–7, the depletion drain-extended MOS devices of the invention may be electrically isolated from the device substrate through provision of buried layers located beneath the depletion devices. FIG. 5 illustrates an alternate implementation of a depletion DENMOS device 102*a*, with an n-doped buried layer (NBL) 200 formed prior to implantation and diffusion of the n and p-wells 108 and 118, where the n-type buried layer 200 isolates the depletion DENMOS from the p-type substrate 104. Two other possible implementations of the invention are illustrated in FIGS. 6 and 7, in which high voltage depletion DENMOS transistors are illustrated with and without buried layer isolation, respectively, and in which the field oxide is replaced with STI type isolation structures 134*a* in accordance with the invention. A semiconductor device 102*b* is shown in FIG. 6 including a depletion DENMOS transistor formed generally as described above, except that STI dielectric structures 134*a* are used for the DENMOS thick gate dielectric structure and for isolation. A similar device 102*c* is illustrated in FIG. 7 with a depletion DENMOS device using STI dielectric structures 134*a*, and further comprising an n-type buried layer 200. Other variant implementations are possible within the scope of the invention, wherein depletion drain-extended MOS transistors are provided with STI, LOCOS (field oxide) or other thick dielectric structures, alone or in combination with buried layer type isolation techniques.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of fabricating a depletion drain-extended MOS transistor, comprising:

forming a first well of a first conductivity type in a substrate;

forming a second well of a second conductivity type in the substrate, the first and second conductivity types being opposite, wherein portions of the first and second wells overlap in a compensated channel region of the substrate;

forming a drain of the first conductivity type in a portion of the first well;

forming a source of the first conductivity type in a portion of the second well;

forming a thick dielectric extending laterally from a first end adjacent the drain to a second opposite end in the first well, the thick dielectric extending into the first well of the substrate;

forming a thin dielectric over the substrate, the thin dielectric extending from the second end of the thick dielectric in the first well to the source in the second well, a portion of the thin dielectric extending over the compensated channel region of the substrate; and forming a conductive gate contact structure extending over the thin dielectric and over a portion of the thick dielectric, wherein said compensated channel region is located directly adjacent said source and spaced apart from said thick dielectric.

2. The method of claim 1, further comprising providing dopants of the second conductivity type in an adjust region of the first well in the substrate proximate the second end of the thick dielectric.

3. The method of claim 2, wherein the first well has a concentration of dopants of the first conductivity type less than or equal to a first concentration value proximate the second end of the thick dielectric, and wherein the adjust region has a concentration of dopants of the second conductivity type at a second concentration value in the adjust region, the second concentration value being less than the first concentration value.

4. The method of claim 2, wherein providing dopants of the second conductivity type in the adjust region comprises implanting dopants of the second conductivity type in the adjust region.

5. The method of claim 4, wherein implanting dopants of the second conductivity type in the adjust region comprises performing a Vt adjust implant using a Vt adjust mask that exposes the adjust region of the substrate.

6. The method of claim 4, wherein implanting dopants of the second conductivity type in the adjust region is done after forming the thick dielectric.

7. The method of claim 2, wherein forming the thick dielectric comprises performing a LOCOS process.

8. The method of claim 2, wherein forming the thick dielectric comprises performing an STI process.

9. The method of claim 2, wherein the first conductivity type is n-type and the second conductivity type is p-type.

10. The method of claim 2, wherein forming the first well comprises implanting dopants of the first conductivity type into a portion of the substrate using a first well mask exposing the compensated channel region, and wherein forming the second well comprises implanting dopants of the second conductivity type into a portion of the substrate using a second mask exposing the compensated channel region.

11. The method of claim 10, wherein dopants of the first conductivity type are implanted using the first mask at a first implantation dose, wherein dopants of the second conductivity type are implanted using the second mask at a second implantation dose, and wherein the first dose is greater than or equal to the second dose.

12. The method of claim 11, wherein the first conductivity type is n-type and the second conductivity type is p-type.

13. A method of fabricating a depletion drain-extended MOS transistor, comprising:

forming a source and a drain in a substrate, the source and drain being of a first conductivity type;

forming a gate structure over a channel region of the substrate, the gate structure comprising:

a thick dielectric having a first end adjacent the drain and extending laterally toward the source to a second opposite end, the thick dielectric extending into the substrate;

a thin dielectric extending over the substrate from the second end of the thick dielectric to the source; and a conductive gate contact structure extending over the thin dielectric and over a portion of the thick dielectric;

forming a compensated channel region extending below a portion of the thin dielectric in the substrate adjacent and physically contacting the source, the compensated channel region comprising dopants of the first and second conductivity types; and forming an adjust region in the substrate proximate the second end of the thick dielectric, the adjust region comprising dopants of the second conductivity type and being spaced apart from said compensated channel region.

14. The method of claim 13, wherein providing dopants of the second conductivity type in the adjust region comprises implanting dopants of the second conductivity type in the adjust region.

15. The method of claim 14, wherein implanting dopants of the second conductivity type in the adjust region comprises performing a Vt adjust implant using a Vt adjust mask that exposes the adjust region of the substrate.

16. The method of claim 13, wherein the first conductivity type is n-type and the second conductivity type is p-type.

17. The method of claim 13, wherein forming a compensated channel region comprises:

implanting dopants of the first conductivity type into a portion of the substrate using a first well mask exposing the compensated channel region; and implanting dopants of the second conductivity type into a portion of the substrate using a second mask exposing the compensated channel region.

18. The method of claim 17, wherein dopants of the first conductivity type are implanted using the first mask at a first implantation dose, wherein dopants of the second conductivity type are implanted using the second mask at a second implantation dose, and wherein the first dose is greater than or equal to the second dose.

* * * * *